(12) United States Patent
Li

(10) Patent No.: US 10,186,507 B2
(45) Date of Patent: Jan. 22, 2019

(54) ELECTROSTATIC DISCHARGE PROTECTION STRUCTURE AND FABRICATING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/662,849

(22) Filed: Jul. 28, 2017

(65) Prior Publication Data
US 2018/0061824 A1 Mar. 1, 2018

(30) Foreign Application Priority Data

Aug. 29, 2016 (CN) .......................... 2016 1 0756374

(51) Int. Cl.
| | | |
|---|---|---|
| *H01L 29/66* | (2006.01) | |
| *H01L 27/02* | (2006.01) | |
| *H01L 21/8234* | (2006.01) | |
| *H01L 27/088* | (2006.01) | |
| *H01L 29/06* | (2006.01) | |

(Continued)

(52) U.S. Cl.
CPC .. *H01L 27/0266* (2013.01); *H01L 21/823431* (2013.01); *H01L 27/0274* (2013.01); *H01L 27/0886* (2013.01); *H01L 29/0688* (2013.01); *H01L 29/1037* (2013.01);
(Continued)

(58) Field of Classification Search
CPC ...................... H01L 27/0886; H01L 29/66545
See application file for complete search history.

(56) References Cited

U.S. PATENT DOCUMENTS

| | | |
|---|---|---|
| 2013/0175578 A1 | 7/2013 | Lee et al. |
| 2014/0092506 A1 | 4/2014 | Ahsan et al. |

(Continued)

OTHER PUBLICATIONS

The European Patent Office (EPO) The Extended European Search Report for 17186866.4 dated Feb. 8, 2018 7 Pages.

*Primary Examiner* — Thomas L Dickey
(74) *Attorney, Agent, or Firm* — Anova Law Group, PLLC

(57) ABSTRACT

An electrostatic discharge protection structure and a fabricating method thereof are provided. The electrostatic discharge protection structure comprises: a substrate; multiple fin portions arranged on the substrate; a gate structure on the substrate across the fin portions, and on a portion of top surfaces and sidewalls of the fin portions; a first groove in the substrate and overlapping with a first extension pattern of the fin portions; a first doped epitaxial layer filled within the first groove, and being used as a source; a second groove in the substrate and overlapping with a second extension pattern of the fin portions; and a second doped epitaxial layer filled within the second groove, and being used as a drain.

20 Claims, 7 Drawing Sheets

(51) Int. Cl.
  *H01L 29/10* (2006.01)
  *H01L 29/78* (2006.01)

(52) U.S. Cl.
  CPC .. *H01L 29/66545* (2013.01); *H01L 29/66795* (2013.01); *H01L 29/785* (2013.01)

(56) References Cited

U.S. PATENT DOCUMENTS

| | | |
|---|---|---|
| 2014/0264616 A1 | 9/2014 | Lin et al. |
| 2014/0306296 A1* | 10/2014 | Jeon .................... H01L 27/1104 257/401 |
| 2015/0311342 A1 | 10/2015 | Lin et al. |
| 2016/0181358 A1* | 6/2016 | Zhang ............... H01L 29/66689 257/339 |

* cited by examiner

ELECTROSTATIC DISCHARGE PROTECTION STRUCTURE AND FABRICATING METHOD THEREOF

CROSS-REFERENCES TO RELATED APPLICATIONS

This application claims the priority of Chinese Patent Application No. 201610756374.5, filed on Aug. 29, 2016, the entire contents of which are incorporated herein by reference.

FIELD OF THE DISCLOSURE

The present disclosure generally relates to the field of semiconductor fabricating technology and, more particularly, relates to an electrostatic discharge protection structure and a fabricating method thereof.

BACKGROUND

Integrated circuits (ICs) are susceptible being damaged by static electricity. Generally, protection circuits can be configured on the circuit input/output terminals or on power protection devices to prevent the internal circuitry from being damaged by static electricity.

In the existing integrated circuit design, electrostatic discharge (ESD) protection structure is usually used to reduce the static electricity damage. The existing ESD protection structure mainly include gate-grounded N-type field effect transistor (GGNMOS) protection circuit, silicon controlled rectifier (SCR) protection circuit, lateral double diffusion field-effect transistors (LDMOS) protection circuit, bipolar junction transistor (BJT) protection circuit, etc.

The GGNMOS is a widely used electrostatic discharge protection structure. Since the power consumption of the MOS tube is a product of the current and the voltage drop, under certain ESD static current, if the voltage drop on the MOS tube can be reduced, the junction temperature of the MOS tube can also be reduced, thereby protecting the MOS. As an ESD device, in a forward direction, the GGNMOS depends on the parasitic NPN BJT to discharge the ESD current. The NPN includes an N+ active region of the drain, a P-type substrate, and the N+ active region of the source. A path for discharging the ESD current in a reverse direction includes a PN diode and an NMOS diode connected to the gate source. The PN diode includes a P-type substrate and an N+ active region.

In a full-chip ESD network, when an ESD time is arrived, the GGNMOS may be turned on in both forward direction and reverse direction, which depends on the potential ESD path, because the ESD current always flows to the low-impedance path. Thus, the ESD performance of the GGNMOS in both forward direction and reverse direction should be considered in the design to ensure the reliability of integrated circuits. As a BJT, the GGNMOS has a breakdown working mechanism, the ESD current is discharged depending on a low resistance path formed by a trigger of an avalanche breakdown between the drainregion and the substrate.

However, the performance of the existing electrostatic discharge protection structure needs to be improved. Accordingly, the disclosed item management system and method are directed to solve one or more problems set forth above and other problems.

BRIEF SUMMARY OF THE DISCLOSURE

In accordance with some embodiments of the disclosed subject matter, an electrostatic discharge protection structure and a fabricating method thereof are provided.

One aspect of present disclosure provides an electrostatic discharge protection structure, comprising: a substrate including a first region, a second region, and a third region sequentially arranged in a first direction; a plurality of fin portions arranged on the substrate in parallel in the second region, wherein an extension direction of the plurality of fin portions is parallel to the first direction; a gate structure on the substrate in the second region substrate and across the plurality of fin portions, wherein the gate structure is located on a portion of top surfaces and sidewalls of the plurality of fin portions; a first groove in the substrate in the first region substrate, wherein the first groove overlaps with a first extension pattern of the plurality of fin portions extended in the first direction; a first doped epitaxial layer filled within the first groove, wherein the first doped epitaxial layer is used as a source; a second groove in the substrate in the third region substrate, wherein the second groove overlaps with a second extension pattern of the plurality of fin portions extended in the first direction; and a second doped epitaxial layer filled within the second groove, wherein the second doped epitaxial layer is used as a drain.

In some embodiments, a width of the second groove is larger than a width of the first groove in the first direction.

In some embodiments, the gate structure is on a portion of the substrate in the second region; and the gate structure exposes the plurality of fin portions between the second doped epitaxial layer and the gate structure.

In some embodiments, a length of the plurality of fin portions between the second doped epitaxial layer and the gate structure in the first direction is in a range from 5 angstroms to 35 angstroms.

In some embodiments, the gate structure is located on top surfaces and sidewalls of the plurality of fin portions adjacent to the first doped epitaxial layer.

In some embodiments, an extension direction of the first groove is parallel to the first direction; and an extension direction of the second groove is parallel to the first direction.

In some embodiments, the electrostatic discharge protection structure further comprises: a first dummy gate structure on the substrate in the first region; wherein the first groove is located in the substrate between the first dummy gate structure and the gate structure.

In some embodiments, the electrostatic discharge protection structure further comprises: two second dummy gate structures on the substrate in the third region; wherein the second groove is located in the substrate between the two second dummy gate structure.

In some embodiments, the electrostatic discharge protection structure further comprises: a well region in the substrate in the first region, the second region, the third region, and the plurality of fin portions; wherein a dopant ion type of the well region is different from a dopant ion type of the first doped epitaxial layer.

In some embodiments, the electrostatic discharge protection structure is a gate-grounded N-type field effect transistor device, the dopant ions of the first doped epitaxial layer and the second doped epitaxial layer are N-type ions; or the electrostatic discharge protection structure is a gate-grounded P-type field effect transistor device, the dopant ions of the first doped epitaxial layer and the second doped epitaxial layer are P-type ions.

In some embodiments, a material of the first doped epitaxial layer is one of Si, Ge, SiGe, or SiC containing dopant ions; and a material of the second doped epitaxial layer is one of Si, Ge, SiGe or SiC containing dopant ions.

In some embodiments, the electrostatic discharge protection structure further comprises: a top surface of the substrate in the first region is in a same level with top surfaces of the plurality of fin portions in the second region; and a top surface of the substrate in the third region is in the same level with top surfaces of the plurality of fin portions in the second region.

In some embodiments, the electrostatic discharge protection structure further comprises: a plurality of conductive plugs on top surfaces of the gate structure, the first doped epitaxial layer, and the second doped epitaxial layer respectively.

Another aspect of the present disclosure provides a method for forming an electrostatic discharge protection structure, comprising: providing a substrate including a first region, a second region, and a third region sequentially arranged in a first direction; forming a plurality of fin portions arranged on the substrate in parallel in the second region, wherein an extension direction of the plurality of fin portions is parallel to the first direction; forming a gate structure on the substrate in the second region substrate and across the plurality of fin portions, wherein the gate structure is located on a portion of top surfaces and sidewalls of the plurality of fin portions; forming a first groove in the substrate in the first region substrate, wherein the first groove overlaps with a first extension pattern of the plurality of fin portions extended in the first direction; forming a first doped epitaxial layer filled within the first groove, wherein the first doped epitaxial layer is used as a source; forming a second groove in the substrate in the third region substrate, wherein the second groove overlaps with a second extension pattern of the plurality of fin portions extended in the first direction; and forming a second doped epitaxial layer filled within the second groove, wherein the second doped epitaxial layer is used as a drain.

In some embodiments, a process for forming the gate structure includes: forming a gate film on the substrate, top surfaces and sidewalls of the plurality of fin portions; and removing a portion of the gate film located in the first region, the third region, and a portion of the second region adjacent to the third region to form the gate structure; wherein the formed gate structure exposes the plurality of fin portions between the gate structure and the third region.

In some embodiments, the method further comprises: before forming the first groove, forming a first dummy gate structure on the substrate in the first region, wherein a length direction of the first dummy gate structure is parallel to a length direction of the gate structure; and etching the substrate between the first dummy gate structure and the gate structure to form the first groove.

In some embodiments, the method further comprises: before forming the second groove, forming two parallel second dummy gate structures on the substrate in the third region, wherein a length direction of the second dummy gate structures is parallel to the length direction of the gate structure; and etching the substrate between the two second dummy gate structures to form the first groove.

In some embodiments, forming the first doped epitaxial layer includes: performing an in-situ doping in a selective epitaxial process to form the first doped layer; or performing a selective epitaxial process to form a first intrinsic layer that fills the first groove, and doping the first intrinsic layer to form the first doped epitaxial layer.

In some embodiments, the method further comprises: forming a plurality of conductive plugs on top surfaces of the gate structure, the first doped epitaxial layer, and the second doped epitaxial layer respectively.

In some embodiments, a process for forming the substrate and the plurality of fin portions includes: providing an initial substrate including a first region, a second region, and a third region sequentially arranged in the first direction; forming a patterned layer on the initial substrate in the first region, the third region, and a portion of the second region; using the pattern layer as a mask, etching initial substrate in the second region to form the substrate in the second region, and to form the plurality of fin portions protruding from the substrate in the second region; and removing the pattern layer.

Other aspects of the disclosed subject matter can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Reference input now be made in detail to exemplary embodiments of the invention, which are illustrated in the accompanying drawings in order to fully understand and to be able to implement the present disclosure and to realize the technical effect. It should be understood that the following description has been made only by way of example, but not to limit the present disclosure. Various embodiments of the present disclosure and various features in the embodiments that are not conflicted with each other can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

As explained previously, the electrical performance of the existing electrostatic discharge protection structure needs to be improved.

Figure 1:
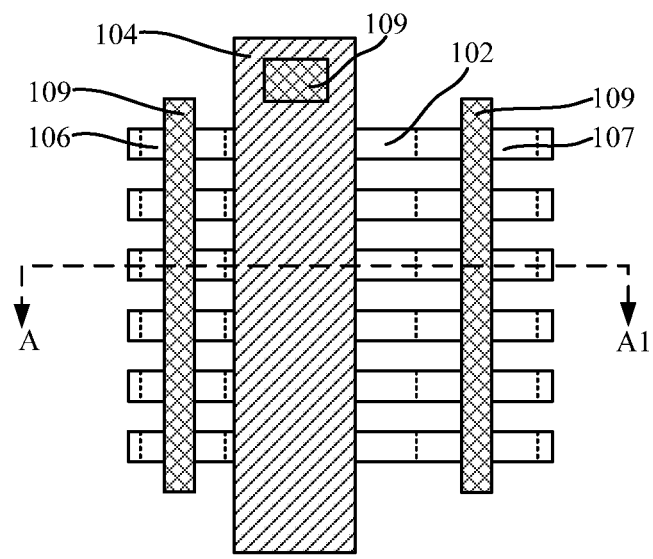
FIGS. 1 and 2 illustrate schematic structural views of an existing electrostatic discharge protection structure.
Figure 2:
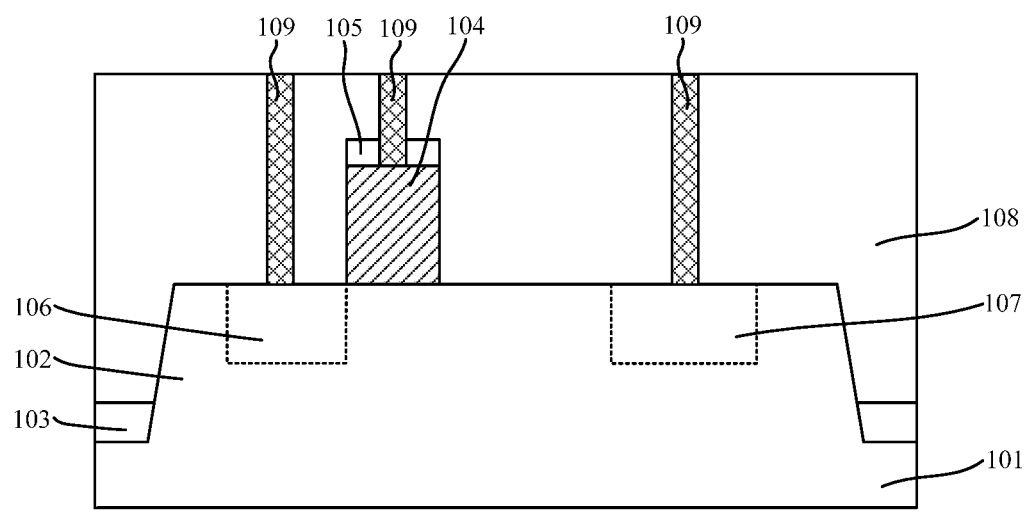

Referring to FIGS. 1 and 2, schematic structural views of an existing electrostatic discharge protection structure are shown. FIG. 1 illustrates a schematic structural top view of the electrostatic discharge protection structure, while FIG. 2 illustrates a schematic structural cross-sectional view of the electrostatic discharge protection structure shown in FIG. 1 along the AA1 direction.

As shown in FIG. 1 and FIG. 2, the electrostatic discharge protection structure includes a substrate 101, multiple discrete fin portions 102 projected from the substrate 101, and an isolation structure 103 on the substrate 101. The isolation structure 103 covers a portion of the sidewalls of the fin portion 102. The top surface of the isolation structure 103 is lower than the top surfaces of the multiple fin portions 102.

The electrostatic discharge protection structure further includes a gate structure 104 disposed on the isolation structure 103 and across the multiple fin portions 102. The gate structure 104 is located on a portion of the top surfaces and sidewalls of the multiple fin portions 102. A hard mask layer 105 is on the top surface of the gate structure 104.

The electrostatic discharge protection structure further includes multiple sources 106 in the multiple fin portions 102 that are on one side of the gate structure 104, and multiple drains 107 in the multiple fin portions 102 that are on the other side of the gate structure 104.

The electrostatic discharge protection structure further includes multiple conductive plugs 109 on the top surfaces of the gate structure 104, the source 106, and the drain 107 respectively.

In the electrostatic discharge protection structure provided above, the multiple fin portions 102 are distributed as a multi-finger shape, and multiple discrete drains 107 are distributed corresponding to the multiple fin portions 102 respectively. However, if one or more of the drains 107 have weak points, the discharge current during the electrostatic discharge may first flow through the weak points of the drains 107. As such, the current density on the drain 107 with a weak point may be too large, which is likely to cause irreversible thermal breakdown. That is, even if the discharge current of the above-described electrostatic discharge structure is small, the discharge current flows mostly through the one or more drain 107 having weak points, thereby causing damage to the electrostatic discharge structure. Therefore, the fail current in the existing electrostatic discharge structure can be small.

Further, since the multiple drains 107 are separated from each other, the trigger voltages corresponding to different drains 107 can be different, resulting in a poor uniformity of the junction depths between the different drains 107 and the substrate 101. Therefore, it is difficult to uniformly start the electrostatic discharge structure provided above, making it difficult to timely discharge the ESD current in the device.

In order to solve the problems described above, the present disclosure provides an electrostatic discharge protection structure and a fabricating method thereof. In some embodiments, the fail current of the ESD protection structure can be improved, and the uniformity of the junction depths between the drain and the substrate respectively corresponding to the multiple fin portions can also be improved. As such, the ESD protection structure can be evenly turned on to discharge the ESD current in time.

The foregoing objects, features and advantages of the present invention will become more apparent from the following detailed description of various embodiments of the present disclosure in connection with accompanying drawings.

Figure 3:
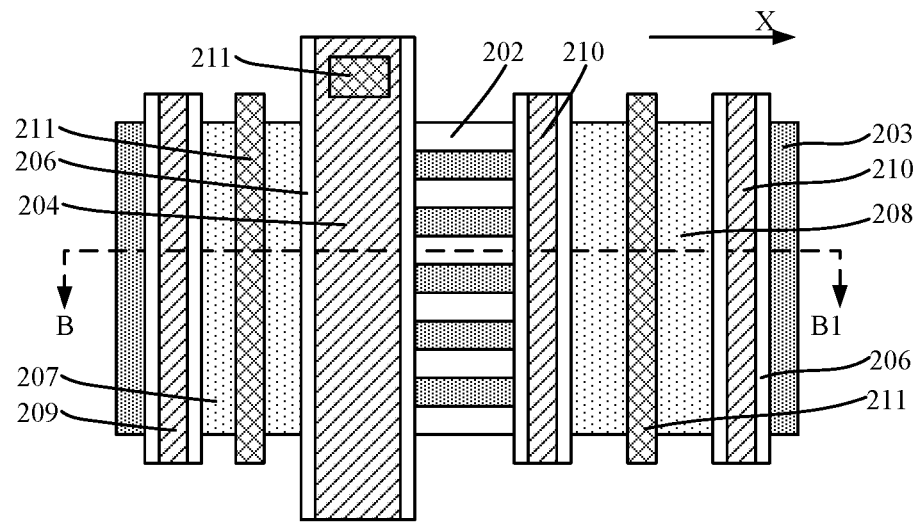
FIG. 3 illustrates a schematic structural top view of an exemplary electrostatic discharge protection structure in accordance with some embodiments of the disclosed subject matter.
Figure 4:
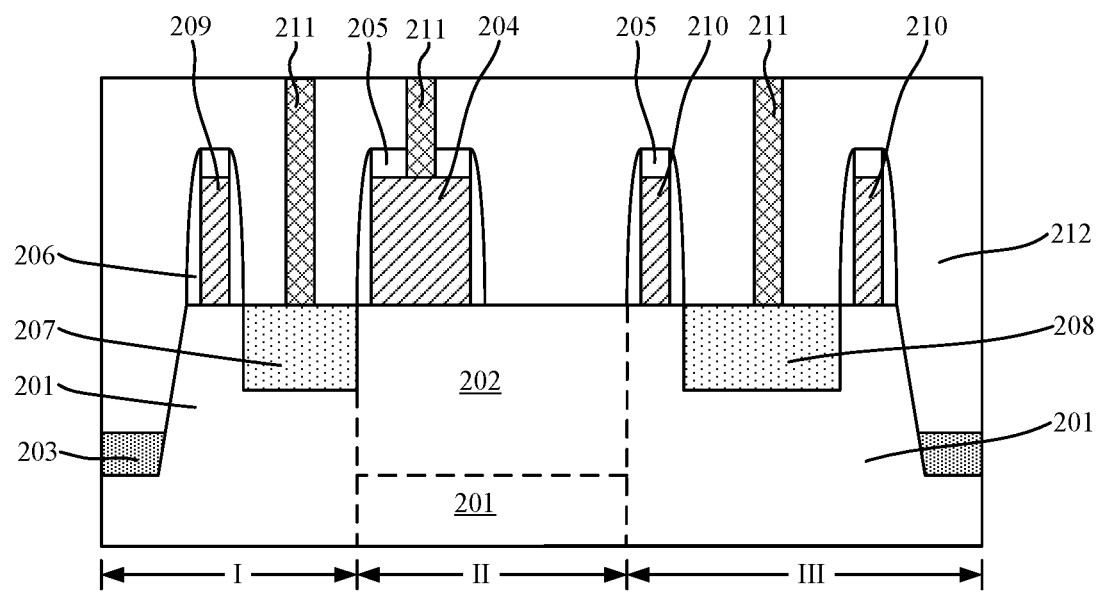
FIG. 4 illustrates a schematic structural cross-sectional view of the electrostatic discharge protection structure shown in FIG. 3 along the BB1 direction.

Referring to FIG. 3, a schematic structural top view of an exemplary electrostatic discharge protection structure is shown in accordance with some embodiments of the disclosed subject matter. FIG. 4 illustrates a schematic structural cross-sectional view of the electrostatic discharge protection structure shown in FIG. 3 along the BB1 direction.

It should be noted that, for convenience of illustration and explanation, certain hard mask layer(s) and/or dielectric layer(s) are not shown in FIG. 3.

As illustrated in FIGS. 3 and 4, the electrostatic discharge protection structure can include a substrate 201. The substrate 201 can include a first region I, a second region II, and a third region III, which are arranged successively. Multiple fin portions 202 arranged in parallel are on the substrate 201 in the second region II. The arrangement direction of the first region I, the second region II, and the third region III is parallel to the extension direction of the multiple fin portions 202, e.g., the X direction as shown in FIG. 3.

The electrostatic discharge protection structure can further include a gate structure 204 located on the substrate 201 in the second region II. The gate structure 204 can cross the multiple fin portions 202, and be located on a portion of the top surfaces and sidewalls of the multiple fin portions 202.

The electrostatic discharge protection structure can further include a first groove in the substrate 201 in the first region I. The first groove overlaps to an extension pattern of the multiple fin portions 202 in the X direction.

The electrostatic discharge protection structure can further include a first doped epitaxial layer 207 filled within the first groove. The first doped epitaxial layer 207 can be used as a source.

The electrostatic discharge protection structure can further include a second groove in the substrate 201 in the third region III. The second groove overlaps to an extension pattern of the multiple fin portions 202 in the X direction.

The electrostatic discharge protection structure can further include a second doped epitaxial layer 208 filled with the second groove. The second doped epitaxial layer 208 can be used as a drain.

In some embodiments, the substrate 201 can be a silicon substrate. In some other embodiments, the substrate 201 may be a germanium substrate, a germanium silicon substrate, a silicon carbide substrate, a gallium arsenide substrate, an indium gallium nitride substrate, a silicon substrate on an insulator, or any other suitable substrate.

A material of the multiple fin portions 202 can be the same material of the substrate 201. In some embodiments, the material of the multiple fin portions 202 can be silicon. A number of fin portions 202 can be larger than or equal to two. As shown in FIG. 3, the number of fin portions 202 is six, which is used merely as an example.

An isolation structure 203 can be on the substrate 201 in the second region II. The isolation structure 203 can be located on a portion of the sidewalls of the multiple fin portions 202. The top surface of the isolation structure 203 can be lower than the top surfaces of the multiple fin portions 202.

In some embodiments, the top surface of the substrate 201 in the first region I can be in a same level with the top surfaces of the multiple fin portions 202, and the top surface of the substrate 20 in the third region III can be in a same level with the top surfaces of the multiple fin portions 202.

In some other embodiments, the top surface of the substrate 201 in the first region I can be higher than the top surfaces of the multiple fin portions 202, and the top surface of the substrate 20 in the third region III can be higher than the top surfaces of the multiple fin portions 202.

In some other embodiments, the top surface of the substrate 201 in the first region I can be lower than the top surfaces of the multiple fin portions 202, and the top surface of the substrate 20 in the third region III can be lower than the top surfaces of the multiple fin portions 202. It should be noted that, the top surface of the substrate 201 in the first region I can be higher than the top surface of the isolation structure 203, and the top surface of the substrate 20 in the third region III can be higher than the top surface of the isolation structure 203.

In some embodiments, the isolation region 203 can be provided on the substrate 201 in the second region II, so that the gate structure 204 can be located on the isolation structure 203 in the second region II.

The multiple fin portions 202 can share the gate structure 204. A length direction of the gate structure 204 can be perpendicular to the extension direction of the multiple fin portions 202. The gate structure 204 can be a polysilicon gate structure or a metal gate structure. The polysilicon gate structure can include a gate dielectric layer and a polysilicon layer on the gate dielectric layer. A material of the gate dielectric layer can be silicon oxide or silicon oxynitride. The metal gate structure can include a gate dielectric layer and a metal layer on the gate dielectric layer. The gate dielectric layer can include an interface layer and a high-k gate dielectric layer on the interface layer. A material of the interface layer can be silicon oxide, and a material of the high-k gate dielectric layer can be a high-k gate dielectric material having a relative permittivity larger than the relative permittivity of the silicon oxide.

In some embodiments, the electrostatic discharge protection structure can further include a hard mask layer 205 on the top surface of the gate structure 204. The hard mask layer 205 can protect the top surface of the gate structure 204. The electrostatic discharge protection structure can further include multiple sidewall spacers 206 located on the sidewalls of the gate structure 204 and the sidewalls of the hard mask layer 205. The multiple sidewall spacers 206 can protect the sidewalls of the gate structure 204.

A material of the hard mask layer 205 can be silicon nitride, silicon carbonitride, or silicon oxynitride. A material of the multiple sidewall spacers 206 can be one or both of silicon oxide and silicon nitride.

In some embodiments, the gate structure 204 can be located on the top surfaces and sidewalls of the multiple fin portions 202 that are adjacent to the first region I. That is, the gate structure 204 can be located on the top surfaces and sidewalls of the multiple fin portions 202 adjacent to the first doped epitaxial layer 207, such that the gate structure 204 can cover the top surfaces and sidewalls of the multiple fin portions 202 that are adjacent to the first region I. It should be noted that, in some other embodiments, the gate structure may expose the multiple fin portions located between the gate structure and the first region.

Further, the gate structure 204 can be located on a portion of the substrate 201 in the second region II. In some embodiments, the gate structure 204 can be located on a portion of the isolated structure 203 in the second region II. The gate structure 204 can expose the multiple fin portions 202 between the second doped epitaxial layer 208 and the gate structure 204. Advantageously, the second doped epitaxial layer 208 acting as a drain can be applied with a relatively high voltage when the electrostatic discharge structure is in operation. Since the second doped epitaxial layer 208 is distant with the gate structure 204, the voltage applied on the second doped epitaxial layer 208 may not have adverse effects to the performance of the gate structure 204. As such, a breakdown of the gate dielectric layer in the gate structure 204 in a high voltage electric field can be avoid.

In the extension direction of the multiple fin portions 202, the length of the multiple fin portions 202 between the second doped epitaxial layer 208 and the gate structure 204 may equal to the distance between the drain and gate structure. The length cannot be too short nor too long. If the distance between the drain and the gate structure 204 is too short, the voltage applied to the drain may adversely affect the gate structure 204. If the distance between the drain and the gate structure 204 is too long, the gate structure 204 may have a too weak control to the channel.

Accordingly, in some embodiments, the length of the multiple fin portions 202 between the second doped epitaxial layer 208 and the gate structure 204 in the extension direction of the multiple fin portions 202 can be in a range from 5 angstroms to 35 angstroms.

The first groove can be located in the substrate 201 in the first region I, and the second groove can be located in the substrate 201 in the third region III. As such, the first groove and second groove can be are located on the opposite sides of the gate electrode structure 204 respectively.

The first groove can overlap to the extension pattern of the multiple fin portions 202 in the X direction. Correspond, the first doped epitaxial layer 207 can also overlap to the extension pattern of the multiple fin portions 202 in the X direction, such that the multiple fin portions 202 can share the source.

The second groove can overlap to the extension pattern of the multiple fin portions 202 in the X direction. Correspondingly, the second doped epitaxial layer 208 can also overlap to the extension pattern of the multiple fin portions 202 in the X direction, such that the multiple fin portions 202 can share the drain.

Therefore, when the electrostatic discharge protection structure is in operation, the drain corresponding to the multiple fin portions 202 can be uniformly turned on, thereby being able to discharge the ESD current in time. Also, since the multiple fin portions 202 share the drain, the discharge current density through the drain can be relatively small, so that the thermal breakdown problem due to the excessive current density can be avoided. As such, the electrostatic discharge structure can be protected, and the fail current of the electrostatic discharge structure can be increased.

The extension direction of the first grooves can be parallel to the direction of the arrangement of the multiple fin portions 202. The extension direction of the second groove can be parallel to the direction of the arrangement of the multiple fin portions 202.

In some embodiments, in the extension direction of the multiple fin portions 202, the width of the second groove can be larger than the width of the first groove. Accordingly, in the extension direction of the multiple fin portions 202, the width of the second doped epitaxial layer 208 is larger than the width of the first doped epitaxial layer 207. Thus, the drain can have a relatively larger surface area, which results a larger surface resistance of the drain. Therefore, the discharge current density flowing through the drain can be small, thereby reducing the heat generated by the discharge current. The thermal breakdown problem caused by the excess heat can be therefore avoided.

In some embodiments, in the extension direction of the multiple fin portions 202, the cross-sectional shape of the first groove can be square, and the cross-sectional shape of the second groove can also be square. In some other embodiments, the cross-sectional shape of the first groove may be U-shaped or sigma-shaped, and the cross-sectional shape of the second groove may be U-shaped or sigma-shaped.

The width of the first groove is smaller than the width of the second groove. Correspondingly, in the extension direction of the multiple fin portions 202, the width of the first doped epitaxial layer 207 is smaller than the width of the second doped epitaxial layer 208.

A material of the first doped epitaxial layer 207 can be Si, Ge, SiGe or SiC, which includes dopant ions. A material of the second doped epitaxial layer 208 can be Si, Ge, SiGe or SiC, which includes dopant ions. The dopant ions can be N-type ions or P-type ions, the N-type ions can be P, As or Sb, and the P-type ions can be B, Ga or In.

In some embodiments, the electrostatic discharge protection structure can be a GGNMOS device. The dopant ions in the first doped epitaxial layer 207 are N-type ions, and the dopant ions of the second doped epitaxial layer 208 are also N-type ions. In some other embodiments, the electrostatic discharge protection structure can be a GGPMOS device. The dopant ions of the first doped epitaxial layer are P-type ions, and the dopant ions of the second doped epitaxial layer are also P-type ions.

In some embodiments, a well region can be in the substrate 201 of the first region I, the second region II, and the third region III, and in the multiple fin portions 202. The type of the dopant ions in the well region is different with the type of the dopant ions in the first doped epitaxial layer 207. In some embodiments, when the electrostatic discharge structure is a GGNMOS device, the well region is a P-type well region, and the dopant ions in the well region are P-type ions. In some other embodiments, when the electrostatic discharge structure is GGPMOS, the well region is an N-type well region, and the dopant ions in the well region are N-type ions.

In some embodiments, the electrostatic discharge protection structure can further include a first dummy gate structure 209 on the substrate 201 in the first region I. The first groove can be located in the substrate 201 between the first dummy gate structure 209 and the gate structures 204.

The first dummy gate structure 209 can be used to define the boundary of the first groove. Further, when the first doped epitaxial layer 207 is formed in the first groove, the first dummy gate structure 209 can also be used to limit the growth of the first doped epitaxial layer 207 to prevent the top surface of the first doped epitaxial layer 207 from being too high.

In some embodiment, a material of the first dummy gate structure 209 can be the same material of the gate structure 204. In some other embodiments, the material of the first dummy gate structure 209 may be different from the material of the gate structure. For example, the material of the first dummy gate structure 209 may be amorphous carbon. The material lattice constant of the first dummy gate structure 209 can be greatly different from the material lattice constant of the first doped epitaxial layer. As such, during the selective epitaxial process to form the first doped epitaxial layer, extra epitaxial film may not grow on the first dummy gate structure 209.

In some embodiments, the top surface of the first dummy gate structure 209 can be in a same level with the top surface of the gate structure 204. A hard mask layer 205 can be located on the top surface of the first dummy gate structure 209. Multiple sidewall spacers 206 can be located on the sidewalls of the first dummy gate structure 209.

The electrostatic discharge protection structure can further include at least two second dummy gate structures 210 discretely on substrate 201 in the third region III. The second groove can be located in the substrate 201 between adjacent second dummy gate structures 210.

The second dummy gate structures 210 can be used to define a boundary of the second groove. When the second doped epitaxial layer 208 is formed in the second groove, the second dummy gate structures 210 may limit the growth of the second doped epitaxial layer 208 to prevent the top surface of the second doped epitaxial layer 208 from being too high.

In some embodiments, the material of the second dummy gate structure 210 is the same material of the gate structure 204. In other embodiments, the material of the second dummy gate structure 210 may be different from the material of the gate structure. For example, the material of the second dummy gate structure 210 may be amorphous carbon. The material lattice constant of the second dummy gate structure 210 can be greatly different from the material lattice constant of the second doped epitaxial layer. As such, during the selective epitaxial process to form the second doped epitaxial layer, extra epitaxial film may not grow on the second dummy gate structure 210.

In some embodiments, the top surface of the second dummy gate structure 210 can be in a same level with the top surface of the gate structure 204. A hard mask layer 204 can be located on the top surface of the second dummy gate structure 209. Multiple sidewall spacers 206 can be located on the sidewalls of the second dummy gate structure 210.

In some embodiments, the electrostatic discharge protection structure can further include multiple conductive plugs 211 on top surfaces of the gate structure 204, the first doped epitaxial layer 207, and the second doped epitaxial layer 208, respectively. A material of the multiple conductive plugs 211 may be copper, aluminum or tungsten.

The conductive plug 211 on the top surface of the gate structure 204 can penetrate through the hard mask layer 205.

In some embodiments, the electrostatic discharge protection structure can further include a dielectric layer 212 on the first doped epitaxial layer 207, the second doped epitaxial layer 208, the gate structure 204, the first dummy gate structure 209, and the second dummy gate structure 210. A top surface of the dielectric layer 212 can be higher than the top surface of the gate structure 204. In some embodiments, the top surface of the dielectric layer 212 can be in a same level with the top surfaces of the multiple conductive plugs 211. A material of the dielectric layer 212 can be silicon oxide, silicon nitride, or silicon oxynitride.

In the disclosed electrostatic discharge protection structure, the multiple fin portions 202 can share the drain. When the electrostatic discharge protection structure is in operation, the drain corresponding to the multiple fin portions 202 can be uniformly turned on to timely discharge the ESD current. Considering a same discharge current, comparing to the existing discrete drain structure, the discharge current density in the shared drain is much lower. As such, the thermal breakdown problem caused by the excessive current density can be avoided. Therefore, the disclosed electrostatic discharge structure can provide an increased fail current to prevent the electrostatic discharge structure from being damaged.

Figure 13:
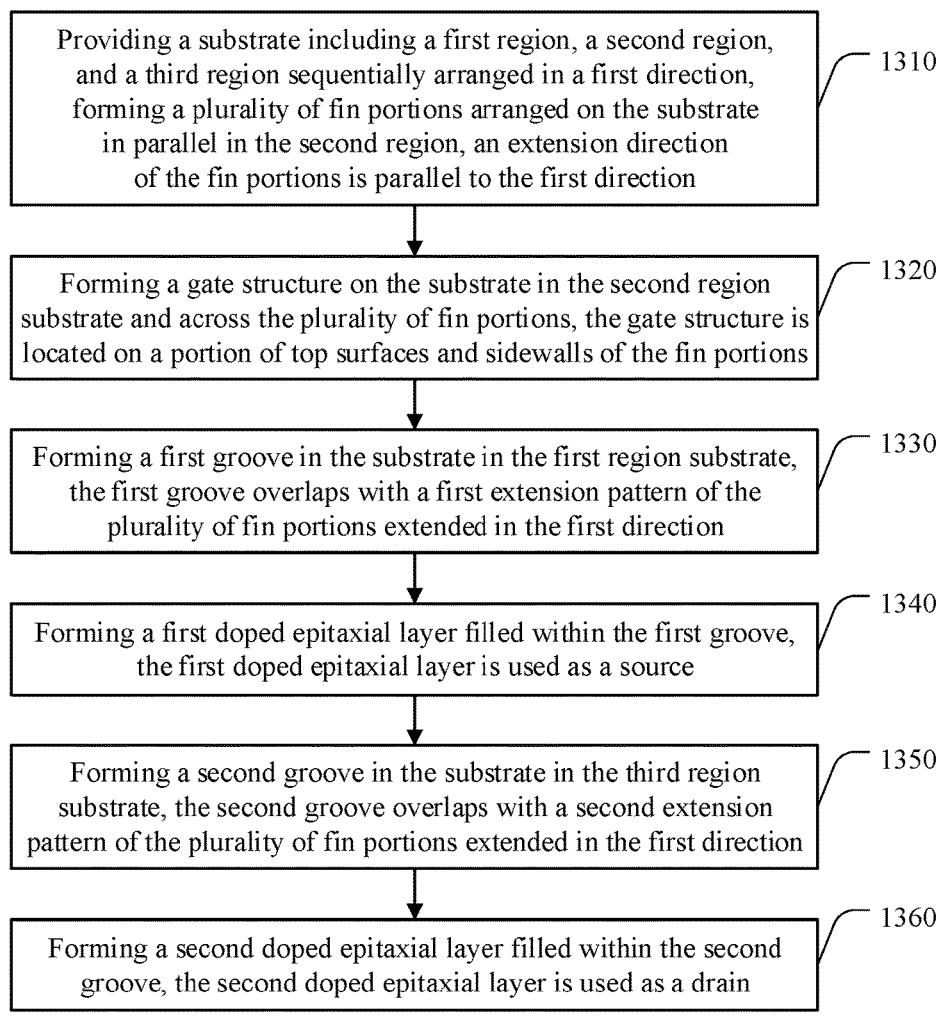
FIG. 13 illustrates a schematic flow diagram of an exemplary method for fabricating an electrostatic discharge protection structure in accordance with some embodiments of the disclosed subject matter.

Referring to FIG. 13, a schematic flow diagram of an exemplary method for fabricating an electrostatic discharge protection structure is shown in accordance with some embodiments of the disclosed subject matter.

As illustrated, the method can include the following steps.

At step 1310, a substrate can be provided. A first region, a second region, and a third region can be successively arranged on the substrate. Multiple fin portions arranged in parallel can be configured in the second region. The first region, the second region, and the third region can be arranged successively in an extension direction of the multiple fin portions.

At step 1320, a gate structure across the multiple fin portion can be formed on the substrate in the section region. The gate structure can be located on a portion of the top surfaces and sidewalls of the multiple fin portions.

At step 1330, a first groove can be formed in the substrate in the first region. The first groove can overlap with a first extended pattern of the multiple fin portions in the extension direction of the multiple fin portions.

At step 1340, a first doped epitaxial layer filled with the first groove can be formed. The first doped epitaxial layer can be used as a source.

At step 1350, a second groove can be formed in the substrate in the third region. The second groove can overlap with a second extended pattern of the multiple fin portions in the extension direction of the multiple fin portions.

At step 1360, a second doped epitaxial layer filled with the second groove can be formed. The second doped epitaxial layer can be used as a drain.

It should be noted that the above steps of the flow diagram of FIG. 13 can be executed or performed in any order or sequence not limited to the order and sequence shown and described in the figure. Also, some of the above steps of the flow diagram of FIG. 13 can be executed or performed substantially simultaneously where appropriate or in parallel to reduce latency and processing times. For example, steps 1330 and 1350 can be performed simultaneously in some embodiments. Furthermore, it should be noted that FIG. 13 is provided as an example only. At least some of the steps shown in the figure may be performed in a different order than represented, performed concurrently, or altogether omitted.

Referring to FIGS. 5-12, schematic structural views of an exemplary electrostatic discharge protection structure at certain stages of a fabricating process are shown in accordance with some embodiments of the disclosed subject matter.

Figure 5:
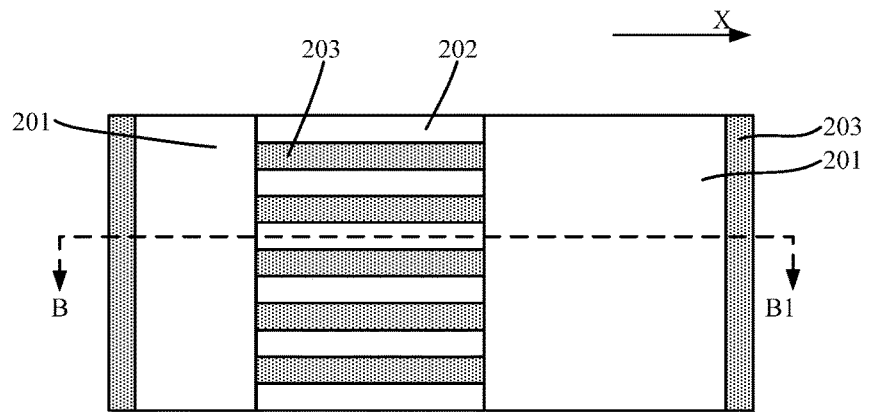
FIGS. 5-12 illustrate schematic structural views of an exemplary electrostatic discharge protection structure at certain stages of a fabricating process in accordance with some embodiments of the disclosed subject matter.
Figure 6:
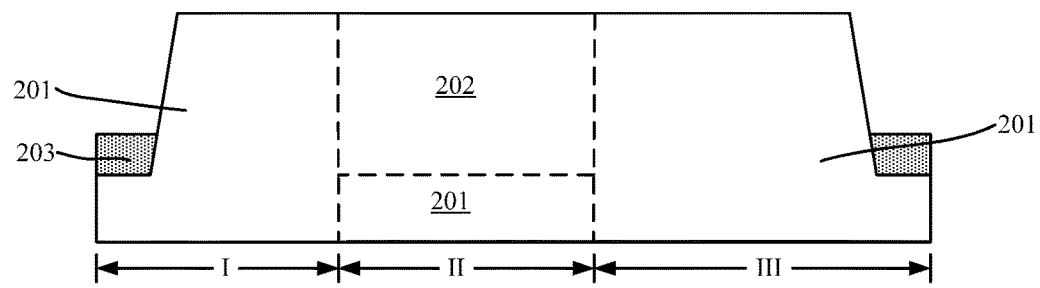

Turning to FIGS. 5 and 6. FIG. 5 shows a top view of the schematic structure, while FIG. 6 shows a cross-sectional view of the schematic structure in FIG. 5 along the BB1 direction. As illustrated, a substrate 201 can be provided (step 1310).

The substrate 201 includes a first region I, a second region II, and a third region III. Multiple fin portions 202 arranged in parallel are on the substrate 201 in the second region II. The arrangement direction of the first region I, the second region II, and the third region III is parallel to the extension direction of the multiple fin portions 202.

An isolation structure 203 is on the substrate 201 in the second region II. The isolation structure 203 covers a portion of the sidewalls of the multiple fin portions 202. The top surface of the isolation structure 203 is lower than the top surfaces of the multiple fin portions 202.

The details of the substrate 201 and the multiple fin portions 202 can be referred to in the foregoing description in connection with FIGS. 3 and 4, and are not be repeated here.

The arrangement direction of the first region I, the second region II, and the third region III is parallel to the extension direction of the multiple fin portions 202, e.g., the X direction as shown in FIG. 5.

A process for forming the substrate 201 and the multiple fin portions 202 can include the following steps. Firstly, an initial substrate having a uniform top surface can be provided. The initial substrate includes a first region I, a second region II, and a third region III. Then, a pattern layer can be formed on the initial substrate in the first region I, the third region III, and a portion of the second region II. Next, using the pattern layer as a mask, the initial substrate in the second region II can be etched. The etched initial substrate can form the substrate 201 and the multiple fin portions 202 projected on the substrate 201 in the second region II. Finally, the pattern layer can be removed.

Figure 7:
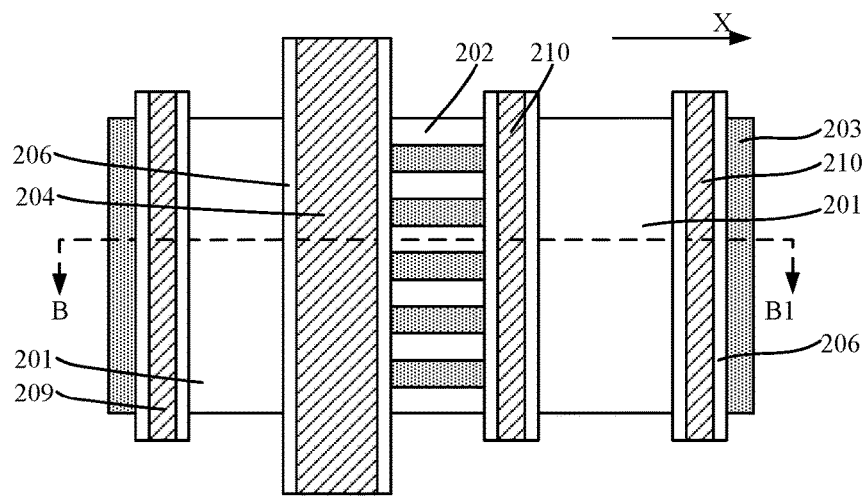
Figure 8:
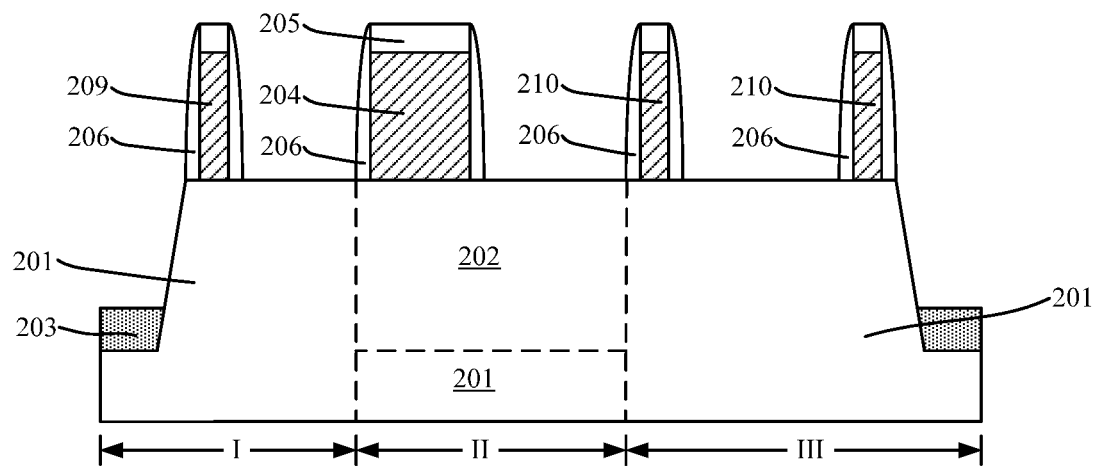

Turning to FIGS. 7 and 8. FIG. 7 shows a top view of the schematic structure, while FIG. 8 shows a cross-sectional view of the schematic structure in FIG. 7 along the BB1 direction. As illustrated, a gate structure 204 can be formed on the substrate 201 in the second region II (step 1320). The gate structure 204 can cross the multiple fin portions 202, and be located on a portion of the top surfaces and sidewalls of the multiple fin portions 202.

In some embodiments, since the isolation structure 203 is on the substrate 201 in the second region II, the gate structure 204 is correspondingly located on the isolation structure 203.

A process for forming the gate structure 204 can include the following steps. Firstly, a gate film can be formed on the substrate 201 and on the top surfaces and sidewalls of the multiple fin portions 202. Then, the gate film located in the first region I and the third region III, and a portion of the gate film in the second region II adjacent to the third region III can be removed to form the gate structure 204. The gate structure 204 can expose the multiple fin portions between the gate structure 204 and the third region III.

In some embodiments, a hard mask is also formed on the gate film during the formation of the gate structure 204. During the process for forming the gate structure 204 by patterning the gate film, the hard mask can be patterned to form a hard mask layer 205 on the top surface of the gate structure 204.

In some embodiments, a first dummy gate structure 209 can be formed on the substrate 201 in the first region I. The longitudinal direction of the first dummy gate structure 209 is the same as the length direction of the gate structure 204. The first dummy gate structure 209 can be used to define the boundary of a subsequently formed first groove, and to limit the height of a subsequently formed first doped epitaxial layer.

In some embodiments, at least two discrete second dummy gate structures 210 can be formed on the substrate 201 in the third region III. The longitudinal direction of the second dummy gate structures 210 is the same as the length direction of the gate structure 204. The second dummy gate structures 210 can be used to define the boundary of a subsequently formed second groove, and to limit the height of a subsequently formed second doped epitaxial layer.

In some embodiments, the first dummy gate structure 209, the second dummy gate structures 210, and the gate structure 204 can be formed in a same process step. That is, during the process for etching the gate film to form the gate structure 204, a first part of the gate film on the substrate 201 in the first region I can be retained as the first dummy gate structure 209, while a second part of the gate film on the substrate 201 in the third region III can be retained as the second dummy gate structures 210.

Correspondingly, a hard mask layer 205 can be formed on the top surface of the first dummy gate structure 209. Multiple sidewall spacers 206 can be formed on the sidewalls of the first dummy gate structure 209. A hard mask layer 205 can be formed on the top surfaces of the second dummy gate structures 210. Multiple sidewall spacers 206 can be formed on the sidewalls of the first dummy gate structure 209.

In some embodiments, the gate structure 204 can be located on a portion of the substrate 201 in the second region II, and can expose the multiple fin portions 202 between the third region III and the gate structure 204. Therefore, the subsequently formed drain can be distant with the gate structure 204, so that the voltage applied on the drain may have a small effect on the gate structure 204. As such, a breakdown of the gate dielectric layer in the gate structure 204 can be avoid.

Figure 9:
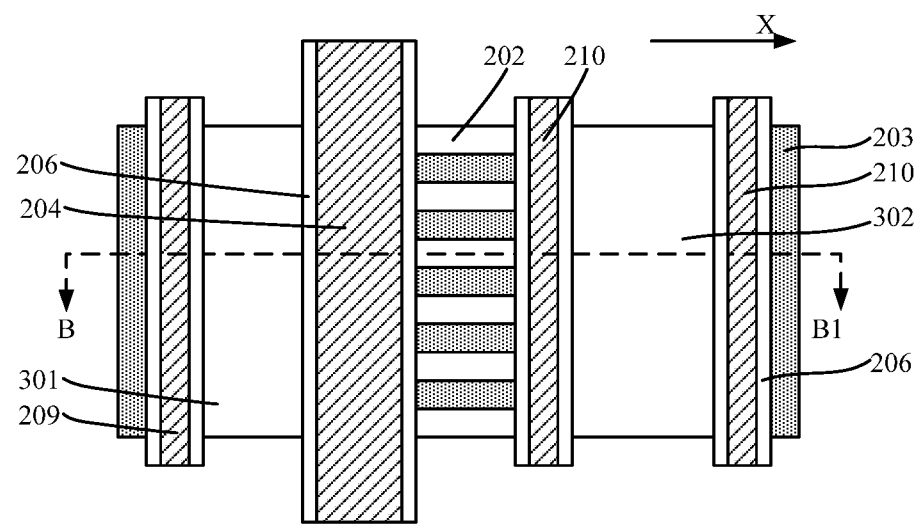
Figure 10:
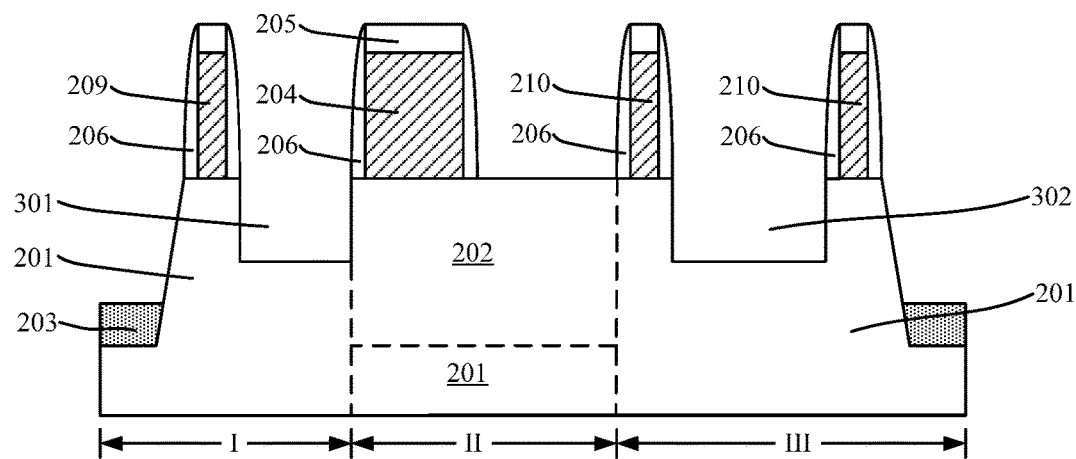

Turning to FIGS. 9 and 10. FIG. 9 shows a top view of the schematic structure, while FIG. 10 shows a cross-sectional view of the schematic structure in FIG. 9 along the BB1 direction. As illustrated, a first groove 301 can be formed in the substrate 201 in the first region I (step 1330), and a second groove 302 can be formed in the substrate 201 in the third region III (step 1350).

The first groove 301 can overlap to a first extension pattern of the multiple fin portions 202 in the X direction. The second groove 302 can overlap to a second extension pattern of the multiple fin portions 202 in the X direction.

The extension direction of the first groove 301 is parallel to the direction of arrangement of the multiple fin portions 202, and extension direction of the second groove 302 is parallel to the direction of arrangement of the multiple fin portions 202.

In some embodiments, in the extension direction of the multiple fin portions 202, the width of the second groove 301 can be larger than the width of the first groove 301. Accordingly, the drain subsequently formed in the second groove 302 can have a relatively larger surface area, which results a larger surface resistance of the drain. Therefore, the discharge current density flowing through the drain can be small, thereby reducing the heat generated by the discharge current. The thermal breakdown problem caused by the excess heat can be therefore avoided.

In some embodiments, a process for forming the first groove 301 and the second groove 302 can include the following steps. By using the gate structure 204 and the first dummy gate structure 209 as a mask, the substrate 201 between the first dummy gate structure 209 and the first dummy gate structure 209 can be etched to form the first groove 301 in the substrate 201 in the first region I. By using the at least two discrete second dummy gate structures 210 as a mask, the substrate 201 between the neighboring second dummy gate structures 210 can be etched to form the second groove 302 in the substrate 201 in the third region III.

It should be noted that, before forming the first groove 301 and the second groove 302, a mask layer covering the multiple fin portions 202 exposed by the gate structure 204 can be formed. The mask layer can be used to prevent the multiple fin portions 202 being etched. The mask layer may also be fin other areas that are not desired to be etched.

In some embodiments, in the extension direction of the multiple fin portions 202, the cross-sectional shape of the first groove 301 can be square, and the cross-sectional shape of the second groove 302 can also be square. The substrate 201 can be etched by using an anisotropic etching process to form the square-shaped first groove 301 and second groove 302.

In some other embodiments, in the extension direction of the multiple fin portions 202, the cross-sectional shape of the first groove may be sigma-shaped, and the cross-sectional shape of the second groove may be sigma-shaped. The substrate 201 can be first etched by using an anisotropic etch process to form initial recesses, and then the initial recesses can be etched by an isotropic etch process to form the sigma-shaped first groove 301 and second groove 302.

In some embodiments, the bottom of the first groove 301 is higher than the bottom of the multiple fin portions 202 in the second region II, and the bottom of the second groove 302 is higher than the bottom of the multiple fin portions 202 in the second region II. In some other embodiments, the bottom of the first groove may be in a same level with or lower than the bottom portion of the multiple fin portions in the second region, and the bottom of the second groove may be in a same level with or lower than the bottom portion of the multiple fin portions in the second region.

In some embodiments, the first groove 301 and the second groove 302 can be formed in a same process step. In some other embodiments, the second groove may be formed after forming the first groove, or the first groove may be formed after forming the second groove.

Figure 11:
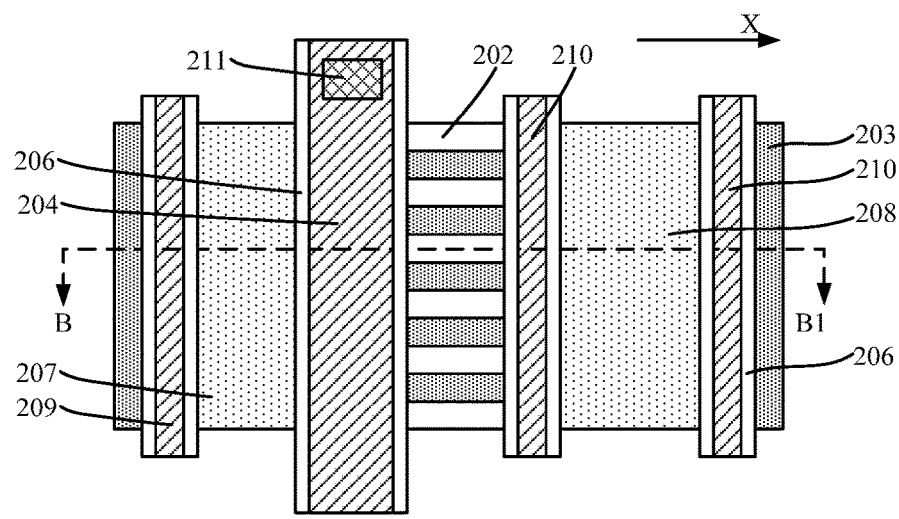
Figure 12:
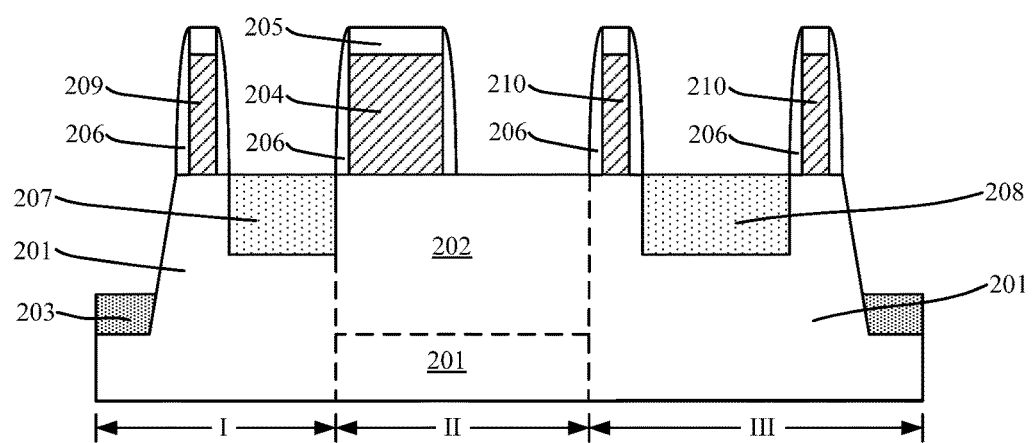

Turning to FIGS. 11 and 12. FIG. 11 shows a top view of the schematic structure, while FIG. 12 shows a cross-sectional view of the schematic structure in FIG. 11 along the BB1 direction. As illustrated, a first doped epitaxial layer 207 filled within the first groove can be formed as the source (step 1340), and a second doped epitaxial layer 208 filled within the second groove can be formed as the drain (step 1360).

In some embodiments, the first doped epitaxial layer 207 is formed by a selective epitaxial process, and the second doped epitaxial layer 208 is formed by a selective epitaxial process.

A material of the first doped epitaxial layer 207 can be Si, Ge, SiGe or SiC, which includes dopant ions. A material of the second doped epitaxial layer 208 can be Si, Ge, SiGe or SiC, which includes dopant ions. The dopant ions can be N-type ions or P-type ions.

In some embodiments, an in-situ doping can be performed in the selective epitaxial process to form the first doped epitaxial layer 207, and an in-situ doping can be performed in the selective epitaxial process to form the second doped epitaxial layer 208.

In some other embodiments, a process for forming the first doped epitaxial layer may further include forming a first intrinsic layer that fills the first groove by using a selective epitaxial process, and performing a doping process to convert the first intrinsic layer into the first doped epitaxial layer. A process for forming the second doped epitaxial layer may further include forming a second intrinsic layer that fills the second groove by using a selective epitaxial process, and performing a doping process to convert the second intrinsic layer into the second doped epitaxial layer.

In some embodiments, the first doped epitaxial layer 207 and the second doped epitaxial layer 208 can be formed in a same process step.

The selective epitaxial process has the selectively growing property according to the different material lattice constants of the growing substrate. The material lattice constants of the first dummy gate structure 209 and the gate structure 204 can be greatly different from the material lattice constant of the first doped epitaxial layer 207. Therefore, the first dummy gate structure 209 and the gate structure 204 located on both sides of the first groove 301 may limit the excessive growth of the first doped epitaxial layer 207 to prevent the formed first doped epitaxial layer 207 from having a too high top surface, e.g., to prevent the top surface of the first doped epitaxial layer 207 from being higher than the top surface of the gate structure 204.

Likewise, the material lattice constants of the second dummy gate structures 210 can be greatly different from the material lattice constant of the second doped epitaxial layer 208. Therefore, the second dummy gate structures 210 on both sides of the second groove 302 may limit the excessive growth of the second doped epitaxial layer 208 to prevent the formed second doped epitaxial layer 208 from having a too high top surface, e.g., to prevent the top surface of the second doped epitaxial layer 208 from being higher than the top surface of the gate structure 204.

Further, the second dummy gate structures 210 on both sides of the second groove 302 may also limit the lateral overgrowth of the second doped epitaxial layer 208 to prevent the formed second doped epitaxial layer 208 from having a too large width above the top surface of the substrate 201.

In some embodiments, the top surface of the first doped epitaxial layer 207 is in a same level with the top surface of the substrate 201, and the top surface of the second doped epitaxial layer 208 is in a same level with the top surface of the substrate 201. In some other embodiments, the top surface of the first doped epitaxial layer 207 is higher than the top surface of the substrate 201, and the top surface of the second doped epitaxial layer 208 is higher than the top surface of the substrate 201.

Referring to FIGS. 3 and 4, in some embodiments, the method for forming the electrostatic discharge protection structure can further include forming multiple conductive plugs 211 on top surfaces of the gate structure 204, the first doped epitaxial layer 207, and the second doped epitaxial layer 208, respectively.

The conductive plug 211 located on the gate structure 204 can be used for electrically connecting the gate structure 204 to the external or another device. The conductive plug 211 located on the first doped epitaxial layer 207 can be used for electrically connecting the source to the external or another device. The conductive plug 211 located on the second doped epitaxial layer 208 can be used for electrically connecting the drain to the external or another device.

A material of the multiple conductive plugs 211 may be copper, aluminum or tungsten.

In some embodiments, before forming the multiple conductive plugs 211, a dielectric layer 212 can be formed on the first doped epitaxial layer 207, the second doped epitaxial layer 208, the gate structure 204, the first dummy gate structure 209, and the second dummy gate structure 210. A top surface of the dielectric layer 212 can be higher than the top surface of the hard mask layer 205.

A process for forming the multiple conductive plugs 211 can include the following steps. Firstly, a patterned mask layer can be formed on the dielectric layer 212 that defines the locations and sizes of the multiple conductive plugs 211 to be formed. Then, using the patterned mask layer as a mask, the dielectric layer 212 can be etched to form via holes that expose the first doped epitaxial layer 207 and the second doped epitaxial layer 208, respectively. The hard mask layer 205 on the top surface of the gate structure 204 can also be etched to form multiple via holes that exposes top portions of the gate structure 204. Next, a conductive material can be filled into the via holes to form the multiple conductive plugs 211.

In the disclosed method for forming the electrostatic discharge protection structure, the second doped epitaxial layer 208 as the drain can be formed to overlap with the extension pattern of the multiple fin portions, so that the multiple fin portions 202 can share the drain. When the formed electrostatic discharge protection structure is in operation, the drain corresponding to the multiple fin portions 202 can be uniformly turned on to timely discharge the ESD current.

Further, since the multiple fin portions 202 share the drain, the surface resistance of the drain can be relatively large, so that the discharge current density in the shared drain can be relatively small. As such, the thermal breakdown problem caused by the excessive current density can be avoided. Therefore, the disclosed electrostatic discharge structure can provide an increased fail current to prevent the electrostatic discharge structure from being damaged.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, an electrostatic discharge protection structure and a fabricating method thereof are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. An electrostatic discharge protection structure, comprising:
 a substrate including a first region, a second region, and a third region sequentially arranged in a first direction;
 a plurality of fin portions arranged on the substrate in parallel in the second region, wherein an extension direction of the plurality of fin portions is parallel to the first direction;
 a gate structure on the substrate in the second region substrate and across the plurality of fin portions, wherein the gate structure is located on a portion of top surfaces and sidewalls of the plurality of fin portions;
 a first groove in the substrate in the first region substrate, wherein the first groove overlaps with a first extension pattern of the plurality of fin portions extended in the first direction;
 a first doped epitaxial layer filled within the first groove, wherein the first doped epitaxial layer is used as a source;
 a second groove in the substrate in the third region substrate, wherein the second groove overlaps with a second extension pattern of the plurality of fin portions extended in the first direction; and a second doped epitaxial layer filled within the second groove, wherein the second doped epitaxial layer is used as a drain.

2. The electrostatic discharge protection structure of claim 1, wherein
a width of the second groove is larger than a width of the first groove in the first direction, and
a width of the second doped epitaxial layer is larger than a width of the first doped epitaxial layer in the first direction.

3. The electrostatic discharge protection structure of claim 1, wherein:
the gate structure is on a portion of the substrate in the second region;
the gate structure exposes the plurality of fin portions between the second doped epitaxial layer and the gate structure; and
a length of the plurality of fin portions between the second doped epitaxial layer and the gate structure in the first direction is in a range from 5 angstroms to 35 angstroms.

4. The electrostatic discharge protection structure of claim 1, wherein:
the plurality of fin portions share the source and the drain,
a top surface of the first doped epitaxial layer in the first region substrate levels with the top surfaces of the plurality of fin portions, and
a top surface of the second doped epitaxial layer in the third region substrate levels with the top surfaces of the plurality of fin portions.

5. The electrostatic discharge protection structure of claim 1, wherein the gate structure is located on top surfaces and sidewalls of the plurality of fin portions adjacent to the first doped epitaxial layer.

6. The electrostatic discharge protection structure of claim 1, wherein:
an extension direction of the first groove is parallel to the first direction; and
an extension direction of the second groove is parallel to the first direction.

7. The electrostatic discharge protection structure of claim 1, further comprising:
a first dummy gate structure on the substrate in the first region;
wherein the first groove is located in the substrate between the first dummy gate structure and the gate structure.

8. The electrostatic discharge protection structure of claim 7, further comprising:
two second dummy gate structures on the substrate in the third region;
wherein the second groove is located in the substrate between the two second dummy gate structure.

9. The electrostatic discharge protection structure of claim 1, further comprising:
a well region in the substrate in the first region, the second region, the third region, and the plurality of fin portions;
wherein a dopant ion type of the well region is different from a dopant ion type of the first doped epitaxial layer.

10. The electrostatic discharge protection structure of claim 1, wherein:
the electrostatic discharge protection structure is a gate-grounded N-type field effect transistor device, the dopant ions of the first doped epitaxial layer and the second doped epitaxial layer are N-type ions; or
the electrostatic discharge protection structure is a gate-grounded P-type field effect transistor device, the dopant ions of the first doped epitaxial layer and the second doped epitaxial layer are P-type ions.

11. The electrostatic discharge protection structure of claim 1, wherein:
a material of the first doped epitaxial layer is one of Si, Ge, SiGe, or SiC containing dopant ions; and
a material of the second doped epitaxial layer is one of Si, Ge, SiGe or SiC containing dopant ions.

12. The electrostatic discharge protection structure of claim 1, wherein:
a top surface of the substrate in the first region is in a same level with top surfaces of the plurality of fin portions in the second region; and
a top surface of the substrate in the third region is in the same level with top surfaces of the plurality of fin portions in the second region.

13. The electrostatic discharge protection structure of claim 1, further comprising:
a plurality of conductive plugs on top surfaces of the gate structure, the first doped epitaxial layer, and the second doped epitaxial layer respectively.

14. A method for forming an electrostatic discharge protection structure, comprising:
providing a substrate including a first region, a second region, and a third region sequentially arranged in a first direction;
forming a plurality of fin portions arranged on the substrate in parallel in the second region, wherein an extension direction of the plurality of fin portions is parallel to the first direction;
forming a gate structure on the substrate in the second region substrate and across the plurality of fin portions, wherein the gate structure is located on a portion of top surfaces and sidewalls of the plurality of fin portions;
forming a first groove in the substrate in the first region substrate, wherein the first groove overlaps with a first extension pattern of the plurality of fin portions extended in the first direction;
forming a first doped epitaxial layer filled within the first groove, wherein the first doped epitaxial layer is used as a source;
forming a second groove in the substrate in the third region substrate, wherein the second groove overlaps with a second extension pattern of the plurality of fin portions extended in the first direction; and
forming a second doped epitaxial layer filled within the second groove, wherein the second doped epitaxial layer is used as a drain.

15. The method of claim 14, wherein a process for forming the gate structure includes:
forming a gate film on the substrate, top surfaces and sidewalls of the plurality of fin portions; and
removing a portion of the gate film located in the first region, the third region, and a portion of the second region adjacent to the third region to form the gate structure;
wherein the formed gate structure exposes the plurality of fin portions between the gate structure and the third region.

16. The method of claim 14, further comprising:
before forming the first groove, forming a first dummy gate structure on the substrate in the first region, wherein a length direction of the first dummy gate structure is parallel to a length direction of the gate structure; and etching the substrate between the first dummy gate structure and the gate structure to form the first groove.

17. The method of claim 16, further comprising:

before forming the second groove, forming two parallel second dummy gate structures on the substrate in the third region, wherein a length direction of the second dummy gate structures is parallel to the length direction of the gate structure; and etching the substrate between the two second dummy gate structures to form the first groove.

18. The method of claim 14, wherein forming the first doped epitaxial layer includes:

performing an in-situ doping in a selective epitaxial process to form the first doped layer; or performing a selective epitaxial process to form a first intrinsic layer that fills the first groove, and doping the first intrinsic layer to form the first doped epitaxial layer.

19. The method of claim 14, further comprising:

forming a plurality of conductive plugs on top surfaces of the gate structure, the first doped epitaxial layer, and the second doped epitaxial layer respectively.

20. The method of claim 14, wherein a process for forming the substrate and the plurality of fin portions includes:

providing an initial substrate including a first region, a second region, and a third region sequentially arranged in the first direction;

forming a patterned layer on the initial substrate in the first region, the third region, and a portion of the second region;

using the pattern layer as a mask, etching initial substrate in the second region to form the substrate in the second region, and to form the plurality of fin portions protruding from the substrate in the second region; and removing the pattern layer.

* * * * *